US012113146B2

(12) United States Patent
Merrett (10) Patent No.: US 12,113,146 B2
(45) Date of Patent: Oct. 8, 2024

(54) OPTICALLY CONTROLLED FIELD EFFECT TRANSISTOR

(71) Applicant: Government of the United States as Represented by the Secretary of the Air Force, Wright-Patterson AFB, OH (US)

(72) Inventor: Joseph Neil Merrett, Decherd, TN (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 17/931,067

(22) Filed: Sep. 9, 2022

(65) Prior Publication Data

US 2023/0070932 A1    Mar. 9, 2023

Related U.S. Application Data

(60) Provisional application No. 63/242,168, filed on Sep. 9, 2021.

(51) Int. Cl.
H01L 31/113    (2006.01)
(52) U.S. Cl.
CPC .............................. H01L 31/1136 (2013.01)
(58) Field of Classification Search
CPC ....... H01L 31/08; H01L 31/09; H01L 31/101; H01L 31/1136; H01L 27/144
See application file for complete search history.

(56) References Cited

U.S. PATENT DOCUMENTS

| 5,411,914 A * | 5/1995 | Chen ..................... H01L 29/517 |
| | | 257/E31.093 |
| 9,900,203 B1 * | 2/2018 | London .................. H04B 3/50 |
| 10,964,733 B2 | 3/2021 | Moens et al. |
| 2004/0180520 A1 * | 9/2004 | Janke ................. H01L 21/28587 |
| | | 257/E29.127 |
| 2016/0276518 A1 * | 9/2016 | Wang .................... H01L 31/119 |

OTHER PUBLICATIONS

Z. Hemmat et al., "Optically-activated cascode configuration for 650 V GaN FET devices and packaging parasitic inductance effects," Optik—Int'l J Light Electron Optics, vol. 178 (2019) 909-917.
A. Mojab et al., "Introducing optical cascode GaN HEMT," IEEE Trans Electron Dev., vol. 64/3 (2017) 796-804.
A.D. Koehler et al., "High voltage GaN lateral photoconductive semiconductor switches," ECS J. Solid State Sci and Tech, vol. 6/11 (2017) S3099-S3102.
S. K. Mazumder, "An overview of photonic power electronic devices," IEEE Trans Power Electronics, vol. 31/9 (2016) 6562-6574.

* cited by examiner

Primary Examiner — William C Trapanese
(74) Attorney, Agent, or Firm — AFMCLO/JAZ; John T. Addicks (57) ABSTRACT

A semiconductor structure configured to implement an optically controlled field effect transistor (FET). In one embodiment, a normally-off, optically controlled FET is realized as a semiconductor structure comprising various regions configured to implement a voltage controlled, normally on, high voltage FET region having integrated thereon a photoconductive region configured to reduce a gate-to-source voltage of the FET in response to light incident upon the photoconductive region so as to turn the FET on.

12 Claims, 6 Drawing Sheets

OPTICALLY CONTROLLED FIELD EFFECT TRANSISTOR

CROSS-REFERENCE TO RELATED APPLICATIONS

This application claims priority to U.S. Provisional Application 63/242,168, filed on Sep. 9, 2021, which is incorporated herein by reference in its entirety.

GOVERNMENT INTEREST

The invention described herein was made by employees of the United States Government and may be manufactured and used by or for the Government of the United States of America for governmental purposes without the payment of any royalties thereon or therefore.

FIELD OF THE DISCLOSURE

The present disclosure generally relates to power photonic devices, and more particularly to an optically controlled FET.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

This is a statement on a current state of the art of power conversion circuits use power transistors controlled by either a voltage or current signal. In some applications, these circuits are subjected to significant electromagnetic interference (EMI). The small electrical control signals used to turn the power transistors on and off can be corrupted by this EMI and thus disrupt proper operation of the circuit. One option to electrically controlled power transistors is to use electronic devices that are controlled by light signals. Light signals are not directly affected by EMI and therefore optically controlled transistors provide a margin of protection against EMI. However, optically controlled transistors are not commonly used for power conversion applications. Direct optically controlled devices (such as photoconductive semiconductor switches (PCSS)) are used for specialty applications where high voltages need to be switched extremely fast. However, these devices typically have relatively high resistance and require high optical input. This limits their use to applications where short pulses of power are needed. Higher gain versions exist, but these devices suffer from low lifetime. Bipolar optical devices (such as optical bipolar junction transistors or avalanche photodiodes) provide gain improvements over PCSS, however, these bipolar devices suffer from slower switching speeds than are needed for modern power conversion applications.

An option to direct optical control of the transistors is to convert an optical signal locally to the appropriate electrical signal. This does protect the signal from EMI corruption along the optical path. However, the conversion circuitry must be then shielded along with the power transistor circuits. This adds complexity and weight. This indirect method also does not address the gate ringing that results from the high-speed switching application itself.

Another option that has been proposed for achieving direct optical switch functionality is to place a discrete low-voltage photoconductive device in series with a discrete higher-voltage normally-on transistor in a so-called cascode arrangement. Electrical versions of the cascode are commercially sold. These electrical cascode circuits combine a low-voltage, normally-off transistor with desirable control characteristics with a normally-on, high-voltage transistor with desirable power handling characteristics. In general, the cascode concept combines a low-voltage device and a high-device in a circuit in such a way that the resulting combination retains the desirable properties of both constituents. Yet, there is a need for improved electrical devices that overcome various deficiencies of conventional devices.

SUMMARY OF THE INVENTION

Various deficiencies in the prior art are overcome below by a semiconductor structure configured to implement an optically controlled field effect transistor (FET). In one embodiment, a normally-off, optically controlled FET is realized as a semiconductor structure comprising various regions or layers configured to implement a voltage controlled, normally on, high voltage FET region having integrated thereon a photoconductive region configured to reduce a gate-to-source voltage of the FET in response to light incident upon the photoconductive region so as to turn the FET on.

Generally speaking, an optically controlled FET according to the embodiments comprises a semiconductor structure configured to form a voltage controlled, normally on, high voltage FET having integrated thereon a photoconductive region configured to reduce a gate-to-source voltage of the FET in response to light incident upon the photoconductive region. For example, a first plurality of layers configured to realize the photoconductive region, and a second plurality of layers configured to realize the FET controlled by an electrical output of the photoconductive region.

The various embodiments described herein may be realized using standard semiconductor device fabrication techniques, such as photolithography, etch processes, ion implantation, and so on. The fabrication process flow may be modified to accommodate epitaxial growth or ion implantation to produce the semiconductor regions of different conductivity.

The photoconductive region may comprise any optoelectronic device suitable for use in the semiconductor fabrication process used to form the semiconductor structure according to the embodiments, such as a photoconductive semiconductor switch (PCSS), optical bipolar junction transistor, avalanche photodiode, and the like.

The FET may comprise any FET suitable for use in the semiconductor fabrication process used to form the semiconductor structure according to the embodiments and, for example, may comprise a junction field effect transistor (JFET), a metal-insulator semiconductor field effect transistor (MISFET) such as a metal oxide semiconductor field effect transistor (MOSFET), a metal-semiconductor field effect transistor (MESFET), and/or other voltage-controlled FET.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for illustrative purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or, unless otherwise indicated (e.g., "or else" or "or in the alternative"). Also, the various embodiments described herein are not necessarily mutually exclusive, as some embodiments can be combined with one or more other embodiments to form new embodiments.

The numerous innovative teachings of the present invention will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments, such as seismology and data fusion.

It is desired to provide an optically controlled transistor having a fast response time, low on-state resistance, and sufficient blocking voltage to be used in power conversion and other applications where fast, efficient, and stable switching is required. Generally speaking, transistors use a small control signal (current, voltage, or optical signal) to control much larger electrical currents through the device. For electrically controlled transistors, electromagnetic interference (EMI) from the system or from an external source can interfere with the control signal and turn on the device at an improper time or even damage the transistor if the EMI is strong enough. The control signal of an optically controlled transistor is immune to EMI. Additionally, new electrically controlled transistors made from wide bandgap semiconductors switch very rapidly. This rapid switching makes the circuits they are a part of susceptible to oscillations, or ringing, in the gate control signal due to stray inductances within the gate control circuit. Optically controlled transistors would also not be susceptible to this ringing. Optically controlled semiconductor devices can be extremely fast and can be made to block very high voltages. However, for an optical device to have high current, or low on-resistance, and high voltage, an excessive amount of optical input is required (i.e., low gain). Optical transistors that do have high gain can suffer from a slow response time.

Various embodiments provide a semiconductor structure configured to implement an optically controlled field effect transistor (FET). In one embodiment, a normally-off, optically controlled FET is realized as a semiconductor structure comprising various regions or layers configured to implement a voltage controlled, normally on, high voltage FET region having integrated thereon a photoconductive region configured to block current flow and increase the gate-to-source voltage thereby turning the device off when light is not incident on the photoconductive region; and, consequently, to reduce a gate-to-source voltage of the FET in response to light incident upon the photoconductive region so as to turn the FET on.

Generally speaking, an optically controlled FET according to the embodiments comprises a semiconductor structure configured to form a voltage controlled, normally on, high voltage FET having integrated thereon a photoconductive region configured to reduce a gate-to-source voltage of the FET in response to light incident upon the photoconductive region. For example, a first plurality of layers configured to realize the photoconductive region, and a second plurality of layers configured to realize the FET controlled by an electrical output of the photoconductive region.

The photoconductive region may comprise any optoelectronic device suitable for use in the semiconductor fabrication process used to form the semiconductor structure according to the embodiments, such as a photoconductive semiconductor switch (PCSS), an optical bipolar junction transistor, an avalanche photodiode, and the like.

The FET may comprise any FET suitable for use in the semiconductor fabrication process used to form the semiconductor structure according to the embodiments and, for example, may comprise a junction field effect transistor (JFET), a metal-insulator semiconductor field effect transistor (MISFET) such as a metal oxide semiconductor field effect transistor (MOSFET) when the insulator is an oxide as is usually the case, a metal-semiconductor field effect transistor (MESFET), and/or other voltage-controlled FET.

In one embodiment, an integrated optically controlled FET device is formed using a MOSFET and a PCSS, wherein a transparent conducting region (region 1) of the PCSS is connected to a gate of the FET, and a photoconductive region (e.g., region 3) of the PCSS is connected to a source of the FET. The PCSS has a blocking voltage that is greater than the gate voltage necessary to turn off the FET (threshold voltage, Vth). Without light on the PCSS, the gate voltage builds until the channel of the FET is turned off. When light is incident upon the PCSS, charge carriers are created and the PCSS is conductive. The voltage across the PCSS (and therefore the gate of the FET) drops to below Vth, and the FET is turned on. In one or more aspects, the present innovation integrates the PCSS with the FET on the same piece of semiconductor material.

Figure 1:
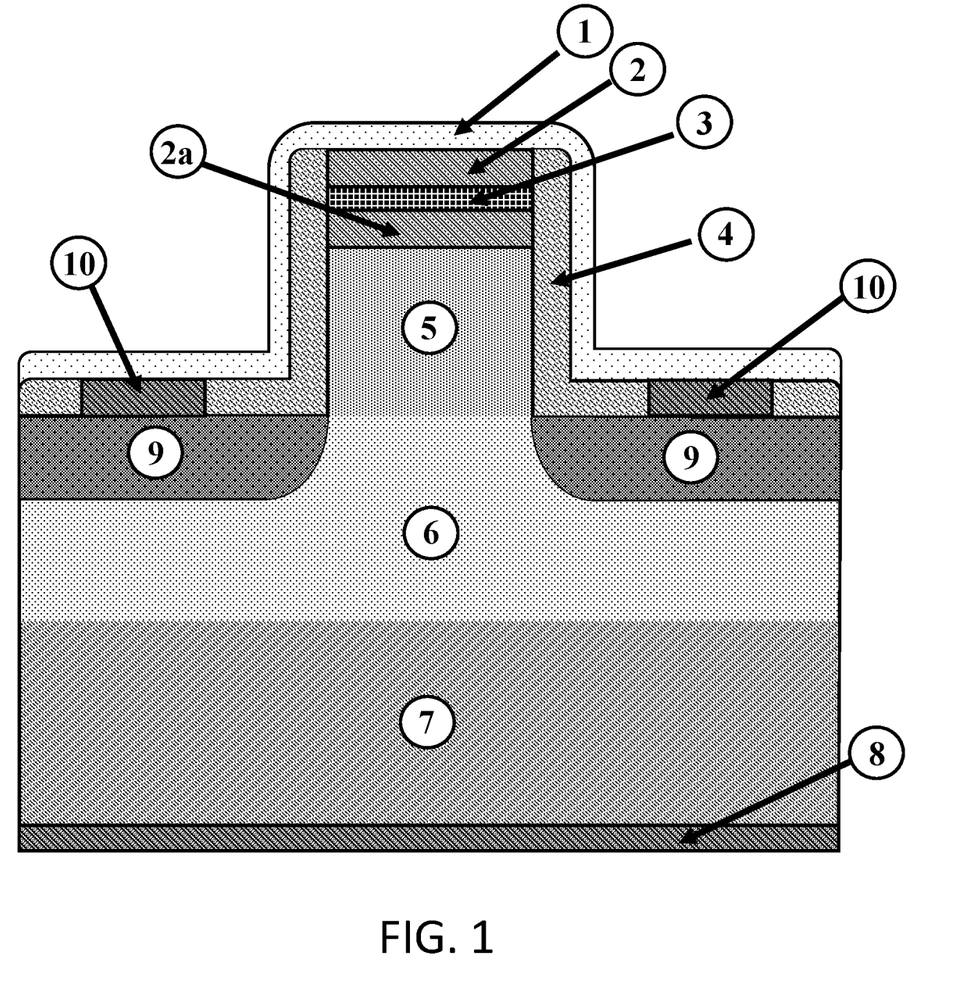
FIG. 1 depicts a cross-sectional diagram of an integrated optically controlled field effect transistor (FET) device illustrative of constituent material layers thereof, according to one or more embodiments.

FIG. 1 depicts a cross-sectional diagram of an integrated optically controlled field effect transistor (FET) device illustrative of constituent material layers (which also may be referred to as regions) thereof, according to one or more embodiments. Specifically, FIG. 1 depicts an optically controlled FET realized via an integrated semiconductor structure 100 including a voltage controlled, normally on, high voltage FET, illustratively a MISFET, having disposed thereon a photoconductive region electrically cooperating with a gate, source, and drain of the MISFET and configured to reduce a gate-to-source voltage in response to light incident upon the photoconductive region. As used herein, the term "photoconductive region" refers to a region or series of regions (layer or series of layers) of the structure 100 of FIG. 1 that is conductive when light is incident upon it, and that is resistive when light is not incident upon it.

Referring to FIG. 1, region 1 is a transparent conducting layer constructed from indium/tin oxide (ITO), another conducting oxide, or a metal layer that is thin enough to be transparent. Ideally, region 1 forms an ohmic contact to a highly doped semiconductor region 2. The purpose of this highly-doped semiconductor region 2 is to reduce any barrier to movement of charge carriers from the transparent conductor of region 1 to the semiconductor material of regions 2 and 3. For most material combinations, the device would still function without region 2, but the performance would be degraded. The conductivity of the semiconductor material of region 2 may be n-type or p-type.

For the embodiment described here, semiconductor regions 2, 2a, 5, 6, and 7 are all of the same conductivity and will be n-type. In addition to forming an electrical contact to region 2, region 1 overlays an insulating region 4. Region 4 is typically constructed from an oxide (such as $SiO_2$ or $Al_2O_3$) and serves as the gate dielectric in contact with a gate conductor (respective portion of region 1 in contact with region 4) for an n-channel MOSFET.

Region 3 is an insulating (or semi-insulating) photoconductive region. Region 3 may be of the same semiconductor type as regions 2, 2a, 5, 6, and 7 in some embodiments. In other embodiments, regions 2 and 3 may be of different material from each other. The material(s) used for region 3 are selected in accordance with the materials selected for the various other regions such that current is able to flow when light is incident upon the photoconductive region, the current further being appropriate to operate the transistor.

Additionally, region 3 may be formed using different material than regions 2a, 5, 6, and 7. Selection and use of different materials is appropriate if band diagrams of the different materials align such that a significant barrier to proper flow of charge carriers is avoided. Region 3 has the property that when light of a proper wavelength is shown on (or incident upon) it, charge carriers are generated. A thickness of region 3 may be selected such that region 3 provides a sufficient barrier to prevent quantum tunneling when light is not incident upon the photoconductive region of the structure 100 of FIG. 1.

Region 2a is an optional layer having the same conductivity type as region 5, but with a much higher doping. The purpose of region 2a is to reduce any potential barrier to movement of charge between region 3 above and the conducting regions 5, 6, and 7 underneath.

With sufficient light intensity incident upon the photoconductive region (region 1 through to region 3) of the structure 100, the generated charge carriers effectively lower the potential barrier between region 2 and region 3 allowing current to flow. This current flow lowers the voltage drop across the device completely unbiasing the gate (region 4 and the respective portion of region 1 overlaying region 4) and turning the device fully on. Region 5 is lighter doped semiconductor with a doping level chosen to achieve the desired Vth while minimizing the resistance of the region. Region 6 is another lightly doped region having a doping level and thickness chosen to optimize the balance between low resistance and high blocking voltage. Region 7 is a highly doped substrate, and region 8 is the drain ohmic contact region. Region 9 is an optional layer doped with a conductivity that is the opposite of a conductivity of region 6. Region 9, when present, serves to enhance a blocking capability of the device by shielding the metal-oxide semiconductor gate (region 4 and the respective portion of region 1 overlaying region 4) from the maximum field.

The transparent conducting region 1 electrically connected to ohmic contact region 10 within insulating region 4 form the gate of the optically controlled MISFET/MOSFET realized via the structure 100 of FIG. 1. The photoconductive region 3 (or junction of region 3 and region 5 (optionally with region 2a there between)) forms the photoconductive region and source of the optically controlled MISFET/MOSFET realized via the structure 100 of FIG. 1. Region 8 forms the drain of the optically controlled MISFET/MOSFET realized by the structure 100 of FIG. 1.

In another embodiment, as an alternative to region 1 serving the dual functions of transparent conducting region (region 1) and of conductor for the MOSFET gate, a different conducting material could be used for the MOSFET gate as long as that conductor is electrically connected to region 1 and is connected to region 1 in such a way that it does not obscure the free passage of light through region 1. Region 8 forms the drain of the MOSFET, and regions 5, 6, and 7 form the channel of the MOSFET.

In one exemplary embodiment, region 2 may be constructure from an n+ GaN; a highly-doped semiconductor with conductivity type the same as regions 5, 6, and 7.

In one exemplary embodiment, optional region 2a may be constructed from an n+ GaN; a highly-doped semiconductor with conductivity type the same as region 2.

In one exemplary embodiment, region 3 may be constructed from an optical GaN; carbon-doped; an insulating or semi-insulating semiconductor region that exhibits photoconductive switch functionality.

In one exemplary embodiment, region 4 may be constructed from $Al_2O_3$ or similar oxide and may form the MOSFET gate dielectric; a dielectric with sufficient thickness and dielectric constant to withstand maximum electric field at device rated blocking voltage.

In one exemplary embodiment, region 5 may be constructed from n– GaN; a lightly doped semiconductor of same conductivity type as region 2.

In one exemplary embodiment, region 6 may be constructed from n– GaN; lightly doped semiconductor of same conductivity type as region 5. Region 6 may be provided with the same doping concentration as region 5 or may be provided with a different doping concentration as region 5 so as to optimize blocking voltage and on-state resistance.

In one exemplary embodiment, region 7 may be constructed from n+ GaN; highly doped semiconductor of same conductivity type as region 6.

In one exemplary embodiment, region 8 may be constructed as metal or a stack of metals, such as Ti, Ni, and Au, which have been annealed above 400° C.; a contact material suitable for ohmic metal-to-semiconductor contact. In other exemplary embodiments, the stack of metals of region 8 may be processed so as to make an ohmic contact. The skilled artisan will readily appreciate that the combination of Ti, Ni, and Au is merely one suitable combination and other stacks of metals could also be used.

In one exemplary embodiment, optional region 9 may be constructed from p-type GaN; formed by methods such as ion implantation or diffusion of dopants of opposite conductivity type as region 6 to serve as field mitigation. It is noted that region 9 is optional, but the p-n junction formed between region 9 and regions 5 and 6 will improve the device's ability to withstand voltage in the off state and will enhance the overall performance of the gate, especially if an ohmic contact (region 10) is fabricated onto region 9 and electrically connected to region 1.

With respect to some exemplary embodiments, regions 2 and 3 are formed of the same material as regions 4, 5, 6, 7, and 9. In various embodiments, regions 2 and 3 are formed of a different material than regions 4, 5, 6, 7, and 9.

The various embodiments described herein may be realized using standard semiconductor device fabrication techniques, such as photolithography, planar processes, ion implantation and so on. The fabrication process flow may be modified to accommodate epitaxial growth or ion implantation to produce the semiconductor regions of different conductivity.

The exemplary embodiment of FIG. 1 is shown with GaN and a normally-on MOSFET for the power section. Another suitable material may be SiC. Conventional photoconductive switches have been made from SiC by incorporating very deep level dopants, such as vanadium. Therefore, yet another way to make this device would be to form region 3 using SiC doped with vanadium to form source fingers of a trench JFET (generally but not exclusively at a narrow region near the top of the source finger) while other regions fabricated of semiconductor material would then be SiC of the appropriate doping type to make a JFET, MESFET, MOSFET, or other transistor.

It is noted that while the FET depicted and described herein with respect to the various embodiments of FIG. 1 comprises a MOSFET, the FET may comprise a different type of MISFET, a MESFET, a JFET, and/or other voltage-controlled FET.

Figure 2:
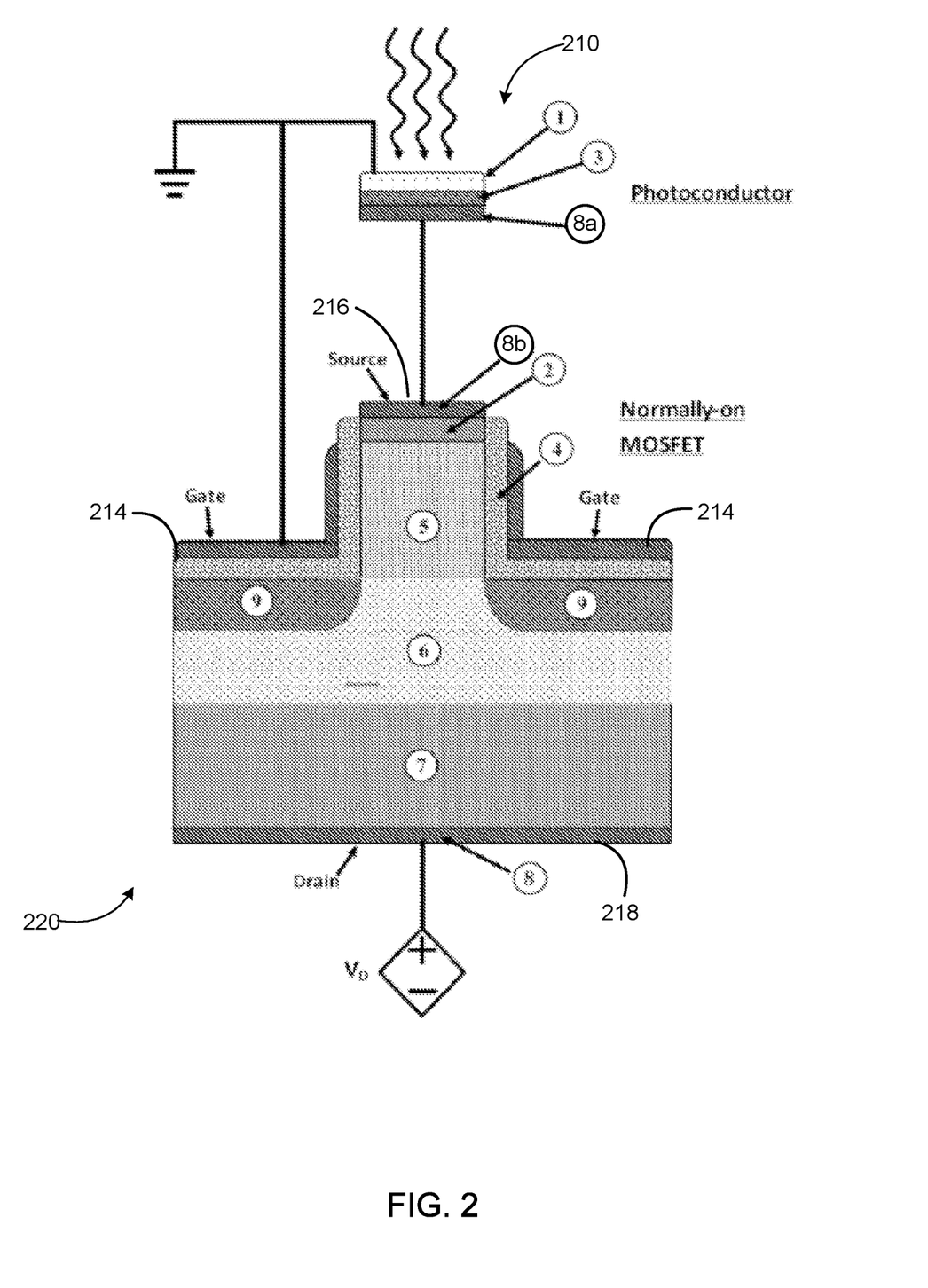
FIG. 2 depicts a conceptual rendering of a discrete optical cascode circuit is modelled as a discrete photoconductor in series with a normally-on MOSFET useful in understanding the various embodiments.

In order to better understand the operation of the various embodiments of FIG. 1, it is useful to consider the photoconductor and MOSFET as two separate devices, as shown in FIG. 2. A photoconductor is a two-terminal device with very high resistance when no light is shown on the device. When light of the appropriate wavelength and intensity is shown on the device, the resistance drops significantly allowing current to flow through the device when a voltage is applied across the two terminals. In the idealized case, the photoconductor device can be considered a switch that is open when the light is off and closed when the light it on.

A normally-on MOSFET is a three-terminal device with source, drain, and gate terminals. With a drain to source voltage applied to the device and no voltage applied from gate to source, current flows freely through the device with little resistance. As a potential lowering voltage is applied to the gate terminal the channel of the device is depleted of charge carriers, narrowing the effective current path and increasing the overall device resistance. With sufficient voltage supplied to the gate, virtually all current flow from source to drain is cut off. This voltage is called the threshold voltage, Vth.

Referring now to FIG. 2, a conceptual rendering of a discrete optical cascode circuit modelled as a photoconductor 210 in series with a normally-on MOSFET 220 and is useful in understanding the various embodiments described herein with respect to the other figures. Specifically, in FIG. 2 the discrete photoconductor 210 may be comprised of regions 1, 3, and 8a, while the discrete MOSFET 220 may be comprised of regions 2, 8b, 4, 5, 9, 6, 7, and 8, wherein the regions may be similar to those described with reference to FIG. 1. However, according to this illustrative model, regions 8a, 8b, and 8 comprise regions similar to region 8 described above with respect to the structure 100 of FIG. 1.

The gate 214 of the MOSFET 220 of FIG. 2 is tied to ground keeping the gate voltage at 0 V whenever the photoconductor 210 is in the on-state, i.e., when light is being shown on (or is incident onto) it. When light is removed from the photoconductor 210, that photoconductor 210 turns off and restricts current flow through the source 216. In this state, the gate-to-source potential increases allowing the gate 214 to deplete the channel (region 5 primarily) of carriers and thereby turn off the MOSFET 220. With the channel completely pinched off, a maximum voltage that can be applied to the drain 218 is completely determined by the blocking voltage of the MOSFET 220. The photoconductor 210 need only be designed so that it can block a voltage as large as the Vth of the MOSFET 220.

It should be noted here that for both the MOSFET 220 and the photoconductor 210, the higher the blocking voltage the MOSFET 220 is designed for, the higher the on-state resistance of the MOSFET 220 will be. The on-state conductivity of the photoconductive device relies on photons for the generation of charge carriers to convert the insulating or semi-insulating region 3 from insulating to conducting. The blocking voltage of this photoconductive device is determined primarily by the thickness of this insulating region 3. Designing the photoconductor 210 for high blocking can therefore require excessive light power in order to achieve suitably low on-resistance. The conductivity of the MOSFET 220, on the other hand, is field controlled and can therefore achieve a much higher blocking voltage to on-resistance ratio.

FIGS. 3-10 are cross-sectional diagrams of various integrated optically controlled FET devices illustrative of constituent material layers thereof and according to one or more embodiments of the present invention.

The integrated optically controlled FET device discussed above with respect to FIG. 1 include various regions 1-8, including optional current enhancing regions 2, 2a, and 5 and an optional voltage blocking enhancing region 9.

The integrated optically controlled FET devices discussed below with respect to FIGS. 3-11 include various layers/regions which will be identified using the same reference designators as used in FIG. 1 unless noted otherwise.

Figure 3:
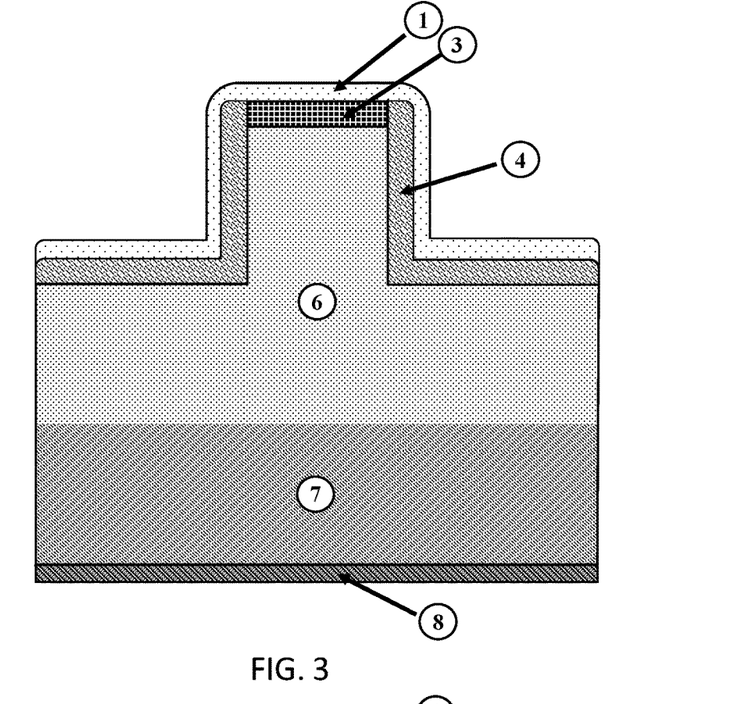
FIGS. 3-10 depict cross-sectional diagrams of various integrated optically controlled field effect transistor (FET) devices illustrative of constituent material layers thereof, according to one or more embodiments.

FIG. 3 depicts an integrated optically controlled FET device such as discussed above with respect to FIG. 1 wherein, as can be seen by inspection, the integrated optical cascode device comprises a Metal-Oxide-Semiconductor (MOS) gate (regions 4, 6, 7, and 8), but does not include the optional current enhancing regions 2, 2a, and 5 (FIG. 1) or the voltage blocking enhancing region 9 (FIG. 1).

Figure 4:
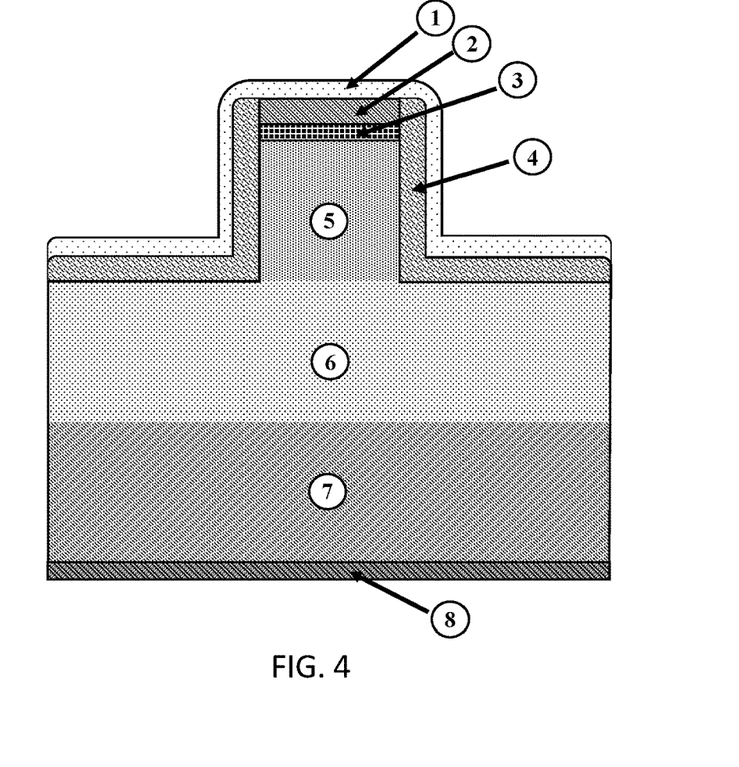

FIG. 4 depicts an integrated optically controlled FET device such as discussed above with respect to FIG. 1 wherein, as can be seen by inspection, the integrated optical cascode device comprises a MOS gate (regions 4, 6, 7, and 8), includes the optional current enhancing regions 2, 2a, and 5 (FIG. 1), but does not include the voltage blocking enhancing region 9.

Figure 5:
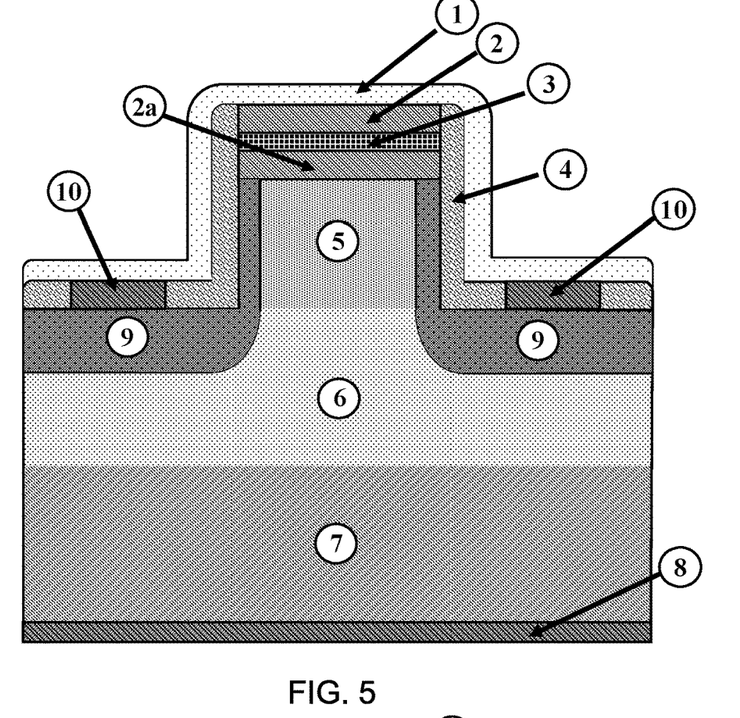

FIG. 5 depicts an integrated optically controlled FET device comprising a JFET gate. The integrated optically controlled FET device of FIG. 5 differs from that of FIG. 1 in that the device of FIG. 1 provides photoconductor related regions that are fully integrated into the MOSFET (region 3 and optional region 2a bounded by region 4 are not in direct contact with region 1), whereas the device of FIG. 5 provides that region 9 extends upwards between regions 4 and 5 such that the p-n junction of regions 9 and 5 provide the gate function.

Figure 6:
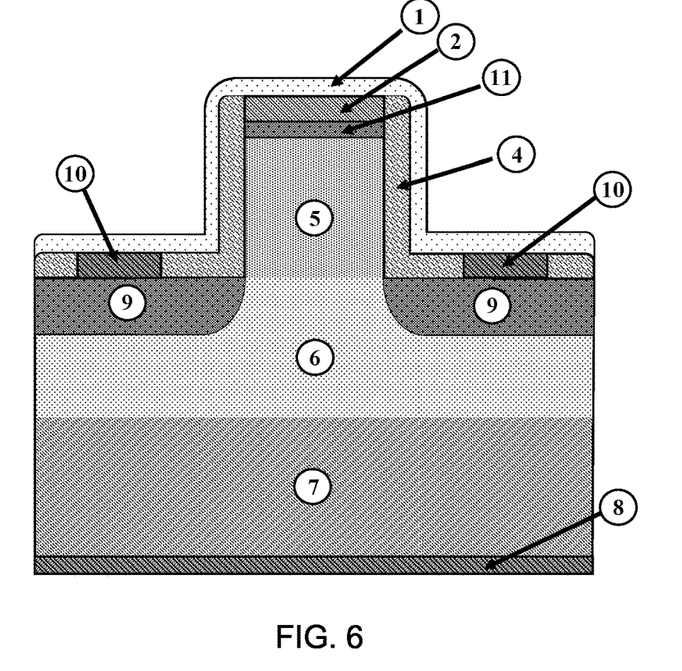

FIG. 6 depicts an integrated optically controlled FET device such as discussed above with respect to FIG. 1 wherein the single photoconductive layer has been replaced with an optical bipolar transistor. The integrated optically controlled FET device of FIG. 6 differs from that of FIG. 1 in that the single photoconductive region 3 (FIG. 1) is replaced with a region 11 of opposite conductivity to adjoining layers 2 and 5 (optional region 2a (FIG. 1) is not used). Regions 2, 11, and 5 then become the emitter, base, and collector, respectively, of an optical bipolar transistor. This optical transistor region serves the same function as the single photoconductive layer in various other embodiments.

An advantage to this embodiment is that the bipolar transistor region has the potential to have much higher optical gain than the simple photoconductive region. A potential disadvantage is that optical bipolar transistors typically have a much slower response than the simple photoconductive layers. However, depending on the speed needed for a given application, the bipolar transistor option could switch fast enough while providing reduced on-state resistance.

A further advantage of this embodiment over using an optical bipolar transistor alone is that the transistor region of this embodiment does not have to block the entire rated voltage of the device. This allows the transistor layers to be optimized for gain and speed without consideration of blocking voltage. Removing this high voltage constraint from the optimization of the bipolar transistor region allows the integrated cascode to have a faster switching speed than a single optical bipolar transistor of equal current and voltage rating.

Figure 7:
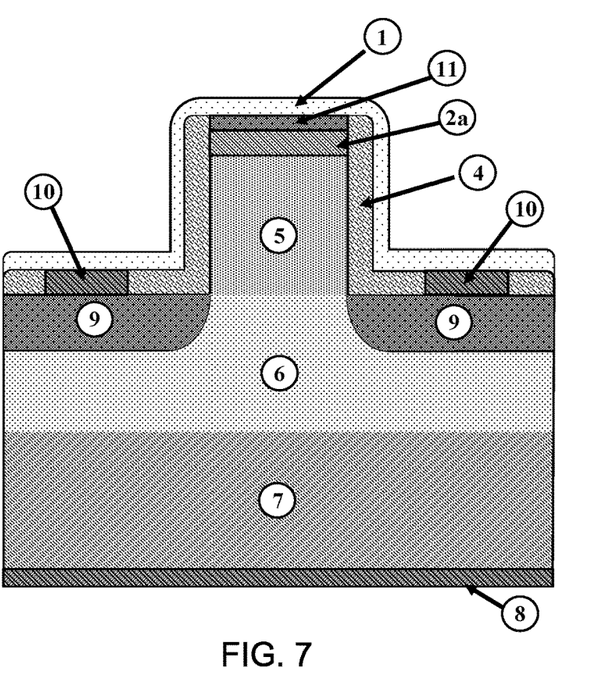

FIG. 7 depicts an integrated optically controlled FET device such as discussed above with respect to FIG. 1 wherein the single photoconductive region 3 (FIG. 1) has been replaced with a photodiode (illustrated as a combination of region 11 with region 2a). The integrated optically controlled FET device of FIG. 7 differs from that of FIG. 1 in that the embodiment of FIG. 7 uses a photodiode region (region 11 with region 2a) to replace the photoconductive region 3 (FIG. 1) Region 11 has the opposite conductivity to regions 5, 6, and 7. Region 2a has the same conductivity as regions 5, 6, and 7. Photodiodes have advantages and disadvantages that are similar to simple photoconductive switches and as the bipolar phototransistors described in the previous version. The photodiode region (region 11 with region 2a) may provide an avalanche photodiode, non-avalanche photodiode, or other type of photodiode.

Figure 8:
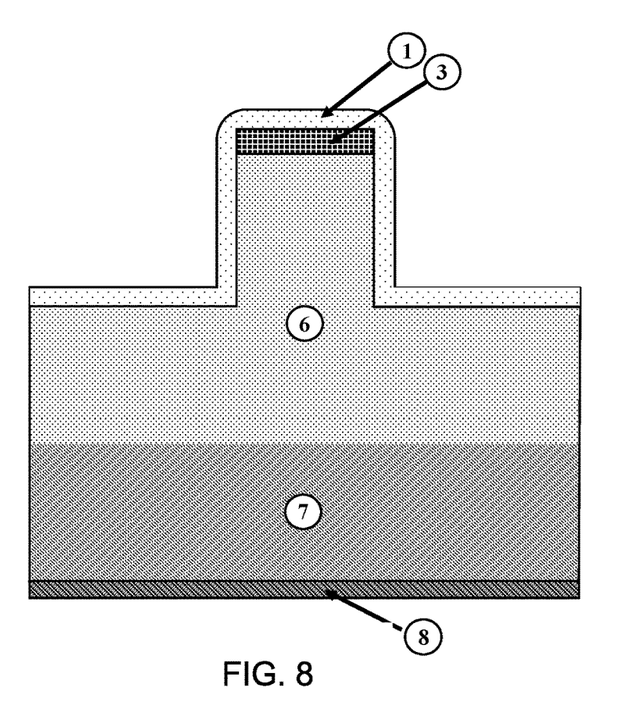

FIG. 8 depicts an integrated optically controlled FET device such as discussed above with respect to FIG. 1 wherein, as can be seen by inspection, the integrated optically controlled FET device comprises a Metal-Semiconductor (MES) gate (regions 6, 7, and 8, but without the insulating gate region 4 (FIG. 1)), but does not include the optional current enhancing regions 2, 2a, and 5 (FIG. 1), or the voltage blocking enhancing region 9 (FIG. 1). Some embodiments of FIG. 8 contemplate that the transparent conductor region 1 may also operate as a Schottky barrier contact to region 6.

Figure 9:
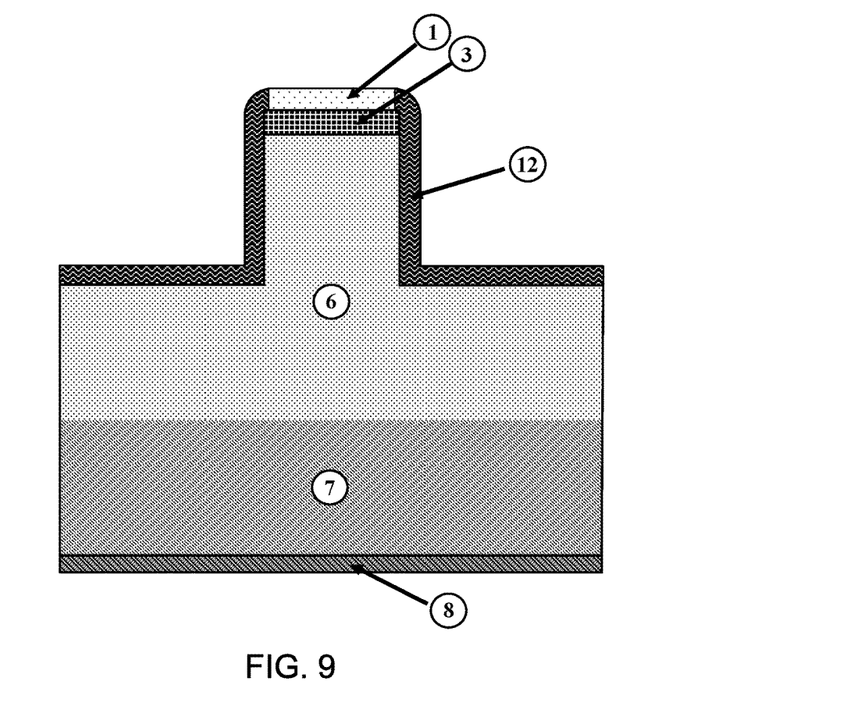

FIG. 9 depicts an integrated optically controlled FET device such as discussed above with respect to FIG. 8 wherein, as can be seen by inspection, the integrated optically controlled FET device comprises a MES gate (regions 6, 7, and 8, but without the insulating gate region 4 (FIG. 1)), but does not include the optional current enhancing regions 2, 2a, and 5 (FIG. 1), or the voltage blocking enhancing region 9 (FIG. 1). The embodiments of FIG. 9 provide an additional metal region 12 that makes a Schottky barrier contact to region 6 and that is electrically connected to the transparent conductor region 1.

Figure 10:
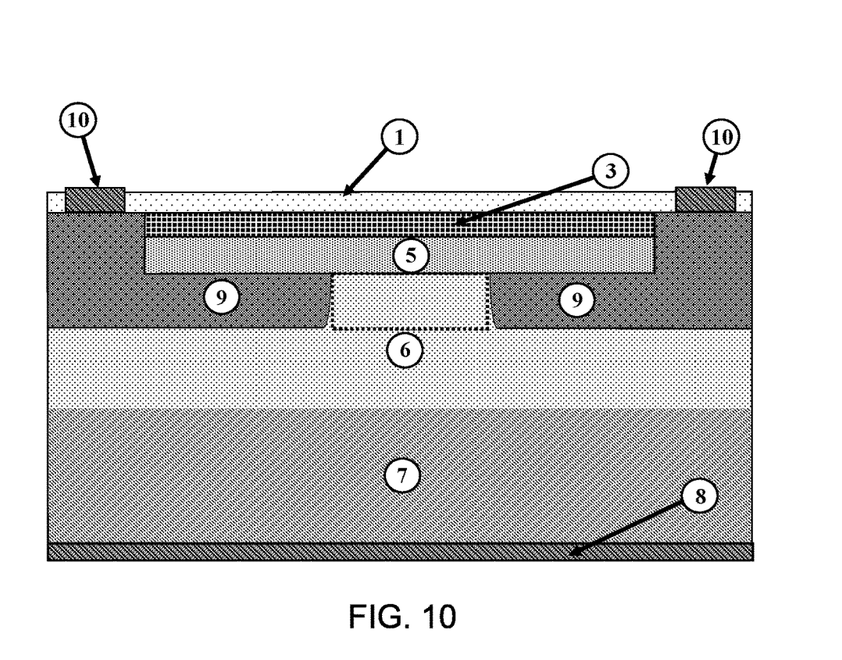

FIG. 10 depicts an integrated optically controlled FET device comprising a JFET gate and formed using a planar process to provide a device formed in accordance with a planar structure. Planar devices are sometimes preferred for ease of manufacturability and integration with other electronic devices on a substrate.

Referring to FIG. 10, regions 5, 6, and 7 are of the same conductivity type. Regions 9 are of the opposite conductivity to regions 5, 6, and 7, thereby creating a p-n junction between regions 9 and 6. Ohmic contact regions 10 and the transparent conductor region 1 are at a common potential as in the other embodiments of the device. A drain is at a different potential and causes the p-n junction between regions 9 and 6 to be reverse biased. When light is absent and the photoconductive layer 3 is insulating, the potential difference between regions 1 and 10 and region 8 may be increased without current flow. The resulting depletion region expanding away from the p-n junction will eventually deplete all the free charge carriers from in between the two regions 9. This state of operation shields region 3 from high electric fields created as the potential difference increases. When light of the proper wavelength is incident upon and through region 1 and onto region 3, region 3 conducts and allows charge to flow, and the depletion region collapses and opens the channel between the two regions 9 (indicated by a dotted line rectangle), thereby turning the device on as in the other variations of the invention.

Broadly speaking, the embodiment of FIG. 10 represents a planar processing implementation of the embodiments of FIG. 5.

The various embodiments provide an integrated optically controlled FET device or apparatus in which a low voltage photoconductive region is integrated with a normally-on semiconductor transistor region to provide a device having an improved gain of the optical switch while also maintaining a high blocking voltage and fast switching capability of a FET.

Various embodiments advantageously provide a high-speed switching photoconductive semiconductor device where the function of blocking the high voltage is provided by a normally-on, electrical FET. In this way, the thickness of a photoconductive region (e.g., region 3 in some embodiments) may be minimized to reduce the on-state resistance of the device while keeping a high switching speed.

The various embodiments may be advantageously employed in various applications, such as for electrical power conversion and distribution with applications in switched mode power supplies, for circuit protection, for high power amplifiers, for high gain optical sensors, and so on. Other uses for devices according to the embodiments include optical triggering applications where very high-power pulses are required.

Various modifications may be made to the systems, methods, apparatus, mechanisms, techniques, and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

What is claimed is:

1. An optically controlled field effect transistor (FET), comprising:
   a semiconductor structure configured to form a voltage controlled, normally on, high voltage FET; and
   a photoconductive region integrated on the semiconductor structure and configured to reduce a gate-to-source voltage of the FET in response to light incident upon the photoconductive region.

2. The optically controlled FET of claim 1, wherein the photoconductive region comprises a photoconductive semiconductor switch (PCSS).

3. The optically controlled FET of claim 1, wherein the photoconductive region comprises a photodiode.

4. The optically controlled FET of claim 1, wherein the photoconductive region comprises an optical bipolar phototransistor.

5. The optically controlled FET of claim 1, wherein the FET comprises one of a junction field effect transistor (JFET), a metal-insulator semiconductor field effect transistor (MISFET), and a metal-semiconductor field effect transistor (MESFET).

6. The optically controlled FET of claim 1, wherein the FET comprises a n-channel metal oxide semiconductor field effect transistor (MOSFET).

7. The optically controlled FET of claim 6, wherein the n-channel MOSFET further comprises a p+ region disposed between the n+ source region and the gate of the MOSFET.

8. The optically controlled FET of claim 7, wherein the n-channel MOSFET further comprises an ohmic contact providing electrical connection between the p+ region and the gate of the FET.

9. The optically controlled FET of claim 7, wherein the photoconductive region further comprises:
   a conductive upper region; and
   an insulating semiconductor region configured to generate charge carriers in response to incident light and disposed upon the n+ source region.

10. The optically controlled FET of claim 9, further comprising:
    a highly-doped semiconductor region disposed between and in ohmic contact with the conductive upper region and insulating semiconductor region of the photoconductive region.

11. The optically controlled FET of claim 9, wherein the highly-doped semiconductor region is further disposed between and in ohmic contact with the n+ source region.

12. The optically controlled FET of claim 9, wherein the n-channel MOSFET further comprises an ohmic contact providing electrical connection between the p+ region and the gate of the FET.

* * * * *